US010022748B2

(12) United States Patent
Suzuki et al.

(10) Patent No.: US 10,022,748 B2
(45) Date of Patent: Jul. 17, 2018

(54) STENCIL MASK, STENCIL MASK MANUFACTURING METHOD, AND IMPRINTING METHOD

(71) Applicant: TOSHIBA MEMORY CORPORATION, Tokyo (JP)

(72) Inventors: Masato Suzuki, Kanagawa (JP); Akiko Mimotogi, Kanagawa (JP); Yohko Komatsu, Kanagawa (JP); Ryoichi Suzuki, Kanagawa (JP); Kazuya Fukuhara, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 244 days.

(21) Appl. No.: 14/793,848

(22) Filed: Jul. 8, 2015

(65) Prior Publication Data

US 2016/0076132 A1    Mar. 17, 2016

(30) Foreign Application Priority Data

Sep. 12, 2014  (JP) ................................. 2014-186729
Mar. 11, 2015  (JP) ................................. 2015-048470

(51) Int. Cl.
| B05D 3/12 | (2006.01) |
| G03F 1/42 | (2012.01) |
| G03F 1/50 | (2012.01) |
| G03F 1/68 | (2012.01) |
| G03F 1/20 | (2012.01) |

(52) U.S. Cl.
CPC ................. *B05D 3/12* (2013.01); *G03F 1/42* (2013.01); *G03F 1/50* (2013.01); *G03F 1/68* (2013.01); *G03F 1/20* (2013.01)

(58) Field of Classification Search
None
See application file for complete search history.

(56) References Cited

U.S. PATENT DOCUMENTS

| 5,991,006 A | 11/1999 | Tsudaka |
| 6,316,151 B1 | 11/2001 | Kim et al. |
| 6,492,070 B1 | 12/2002 | Kobinata |
| 6,780,659 B2 | 8/2004 | Ashida |
| 9,377,682 B2 | 6/2016 | Kanamitsu et al. |
| 2003/0022496 A1* | 1/2003 | Ashida ..................... G03F 1/20 438/690 |
| 2005/0003282 A1 | 1/2005 | Ashida |
| 2007/0077501 A1* | 4/2007 | Nishiwaki .............. B82Y 10/00 430/5 |

(Continued)

FOREIGN PATENT DOCUMENTS

| JP | 09-032349 | 2/1997 |
| JP | 09-218032 | 6/1997 |

(Continued)

*Primary Examiner* — Shamim Ahmed
*Assistant Examiner* — Bradford M Gates
(74) *Attorney, Agent, or Firm* — Finnegan, Henderson, Farabow, Garrett & Dunner, L.L.P.

(57) ABSTRACT

According to one embodiment, a stencil mask includes a first opening and a second opening, the first opening is provided corresponding to a mark region in a template, the second opening is provided adjacent to the first opening, and the diameter of a circle circumscribing the second opening is smaller than the diameter of a circle circumscribing the first opening.

12 Claims, 8 Drawing Sheets

(56) References Cited

U.S. PATENT DOCUMENTS

| | | |
|---|---|---|
| 2009/0244793 A1 | 10/2009 | Kuroda |
| 2013/0001753 A1* | 1/2013 | Kanamitsu ............ G03F 7/0002 |
| | | 257/623 |
| 2013/0164448 A1* | 6/2013 | Moore .................. B05C 21/005 |
| | | 427/282 |

FOREIGN PATENT DOCUMENTS

| | | |
|---|---|---|
| JP | 09-326349 | 12/1997 |
| JP | H10-133358 A | 5/1998 |
| JP | 2000-188254 | 7/2000 |
| JP | 2000-188354 | 7/2000 |
| JP | 2001-044103 | 2/2001 |
| JP | 2003-17397 A | 1/2003 |
| JP | 3649160 | 5/2005 |
| JP | 2006-287005 | 10/2006 |
| JP | 2009-245548 | 10/2009 |
| JP | 2013-33907 A | 2/2013 |

* cited by examiner

STENCIL MASK, STENCIL MASK MANUFACTURING METHOD, AND IMPRINTING METHOD

CROSS-REFERENCE TO RELATED APPLICATIONS

This application is based upon and claims the benefit of priority from Japanese Patent Application No. 2014-186729, filed on Sep. 12, 2014 and Japanese Patent Application No. 2015-48470, filed on Mar. 11, 2015; the entire contents all of which are incorporated herein by reference.

FIELD

Embodiments described herein relate generally to a stencil mask, stencil mask manufacturing method, and imprinting method.

BACKGROUND

Currently, a nanoimprint resist and a template are equal in optical properties. Thus, when the resist is charged into the template, a boundary plane between the template and the resist becomes invisible.

To make the position of the template visible at the time of charging of the resist, a separate material different in optical properties from the resist is embedded into alignment mark regions of the template. As a method for embedding the separate material, ions are implanted in the template via a stencil mask.

DETAILED DESCRIPTION

According to one embodiment, a stencil mask includes a first opening and a second opening. The first opening is provided corresponding to a mark region in a template. The second opening is provided adjacent to the first opening. The diameter of a circle circumscribing the second opening is smaller than the diameter of a circle circumscribing the first opening.

Exemplary embodiments of a stencil mask, stencil mask manufacturing method, and imprinting method will be explained below in detail with reference to the accompanying drawings. The present invention is not limited to the following embodiments.

First Embodiment

Figure 1A:
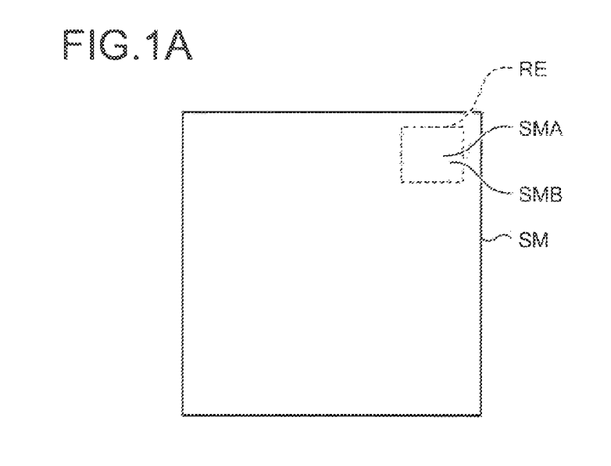
FIG. 1A is a schematic plane view of a stencil mask according to a first embodiment.
Figure 1B:
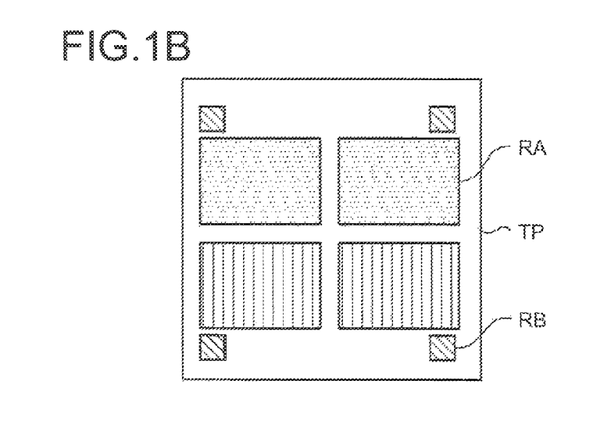
FIG. 1B is a schematic plane view of a template to which the stencil mask in FIG. 1A is applied.
Figure 1C:
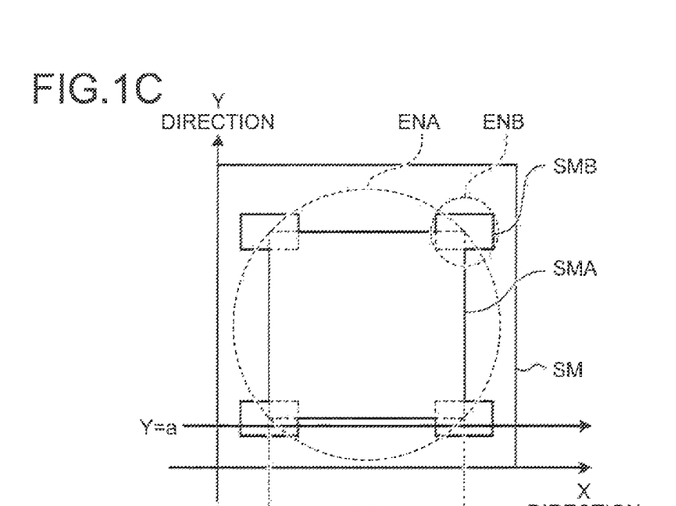
FIG. 1C is an enlarged plane view of an RE portion in FIG. 1A.
Figure 1D:
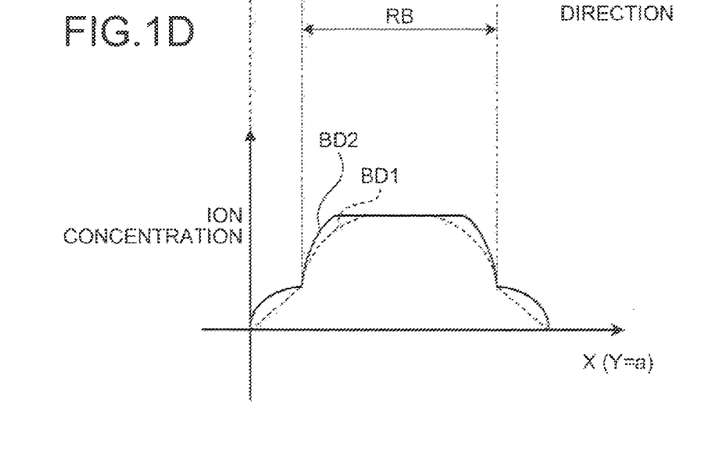
FIG. 1D is a diagram illustrating ion distribution of an ion-implanted layer in FIG. 1B according to the presence or absence of openings SMB in FIG. 1C.

FIG. 1A is a schematic plane view of a stencil mask according to a first embodiment, FIG. 1B is a schematic plane view of a template to which the stencil mask in FIG. 1A is applied, FIG. 1C is an enlarged plane view of an RE portion in FIG. 1A, and FIG. 1D is a diagram illustrating ion distribution of an ion-implanted layer in FIG. 1E according to the presence or absence of openings SMB in FIG. 1C. FIG. 1D illustrates ion distribution at the position Y=a in FIG. 1C. The ion distribution is equal to distribution of light absorption amount in the ion-implanted layer. Ion distribution BD1 is represented without the openings SMB at the four corners of an opening SMA, and ion distribution BD2 is represented with the openings SMB at the four corners of the opening SMA.

Referring to FIG. 1E, a template TP includes a device region RA and mark regions RB. An imprint pattern can be formed in the device region RA. Alignment marks composed of an ion-implanted layer (impurity layer) can be formed in the mark regions RB. The device regions RA and the mark regions RB are provided on the same plane of the template TP. The template TP may be composed of quartz, for example.

Referring to FIGS. 1A and 1C, the stencil mask SM is provided with openings SMA corresponding to the mark regions RB. Openings SMB are added to each of the openings SMA. The openings SMB are adjacent to the opening SMA. A circle ENB circumscribing the opening SMB may be smaller in diameter than a circle ENA circumscribing the opening SMA. The circumscribing here refers to circumscribing the corners of the opening SMA or SMB prior to the addition of the openings SMB to the opening SMA. Alternatively, the openings SMB may be smaller in area than the opening SMA. The area here refers to the area prior to the addition of the openings SMB to the opening SMA. The openings SMB may be provided at the four corners of the opening SMA, for example. In the embodiment, the openings SMA and SMB are square in shape. Alternatively, the shapes of the openings SMA and SMB may be any other polygon such as pentagon or hexagon, or oval or circle. The shape of the openings SMB may be freely selected to make uniform the ion distribution of the ion-implanted layer in the mark regions BB. The stencil mask SM can be made of silicon, for example.

By implanting ions of antimony or the like into the mark regions RB via the stencil mask SM, the ion-implanted layer can be embedded in the mark regions RB. When the openings SMB are not provided at the four corners of the opening SMA, the four corners of the opening SMA are surrounded by the stencil mask SM in two directions, and the ions are less permeable at the four corners than at the center of the opening SMA. Accordingly, when the openings SMB are not provided at the four corners of the opening SMA, ion concentration is lowered drastically at the end portions of the opening SMA as illustrated in FIG. 1D. In contrast, providing the openings SMB at the four corners of the opening SMA can improve ion permeability at the four corners of the opening SMA. This allows uniform ion distribution of the ion-implanted layer formed in the mark regions RB in regions corresponding to the openings SMB, as compared to the case where the openings SMB are not provided at the four corners of the opening SMA.

FIGS. 2A to 2G are cross-sectional views illustrating a template manufacturing method according to the first embodiment.

Figure 2A:
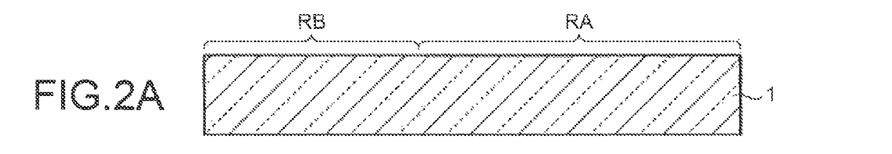
FIGS. 2A to 2G are cross-sectional diagrams illustrating a template manufacturing method according to the first embodiment.
Figure 2B:
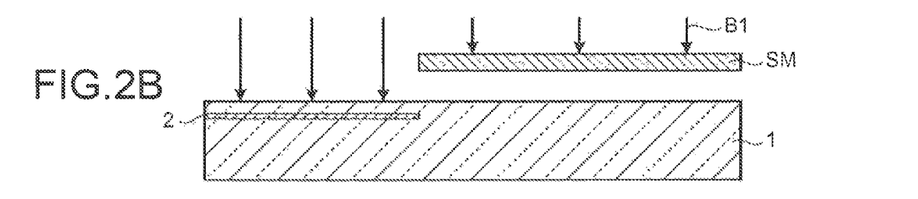

Referring to FIG. 2A, a substrate 1 for use in the template TP is provided with the device region RA and the mark region RB. En addition, as illustrated in FIG. 2B, ion implantation B1 is performed on the substrate 1 via the stencil mask SM to form an ion-implanted layer 2 in the mark region RB. The stencil mask SM has the openings SMA and SMB as illustrated in FIG. 1A, and ions are permeable only to the openings SMA and SMB. This allows selective ion implantation to the substrate 1. Ions to be implanted have the property of absorbing alignment light, and may be different in proportion of absorption of alignment light according to the concentration of the ion-implanted layer 2. At that time, the ion distribution without the openings SMB is BD1, and the ion distribution with the openings SMB is BD2, as illustrated in FIG. 1D. Therefore, providing the openings SMB at the four corners of the opening SMA makes uniform the ion distribution BD2 of the ion-implanted layer 2. By making uniform the ion distribution of the ion-implanted layer 2, the contrast of alignment can even out to improve measurement reproducibility. The ions in the ion-implanted layer 2 may be Sb, Co, Al, Fe, or the like, for example.

Figure 2C:
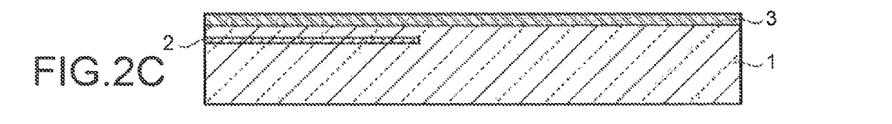

Next, as illustrated in FIG. 2C, a protective film 3 is formed on the substrate 1 by a method such as sputtering or CVD. The material for the protective film 3 may be CrN or the like, for example.

Figure 2D:
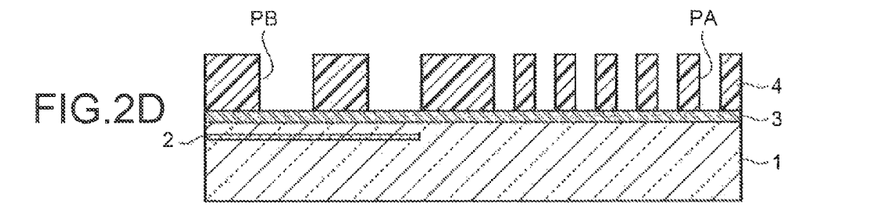

Next, as illustrated in FIG. 2D, a resist pattern 4 is formed on the protective film 3 by the use of a photolithographic technique. The resist pattern 4 may be provided with openings PA corresponding to concave portions 1A and openings PB corresponding to concave portion 1B.

Figure 2E:
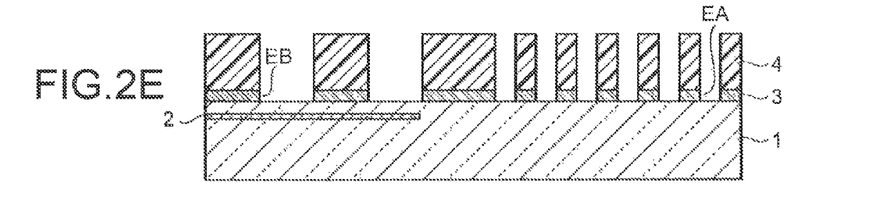

Next, as illustrated in FIG. 2E, the protective film 3 is etched via the resist pattern 4 to transfer the resist pattern 4 onto the protective film 3. At that time, openings EA and EB are formed on the protective film 3 corresponding to the openings PA and PE, respectively.

Figure 2F:
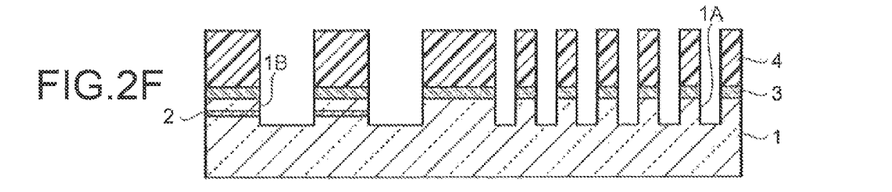

Next, as illustrated in FIG. 2F, the substrate 1 is etched via the resist pattern 4 and the protective film 3. At that time, the concave portions 1A and 1B are formed on the substrate 1 corresponding to the openings EA and EB, respectively. In addition, the ion-implanted layer 2 is patterned corresponding to the concave portions 1B. Accordingly, the alignment marks can be formed in any shape by changing the size and position of the concave portions 1B. Further, patterning the ion-implanted layer 2 corresponding to the concave portions 1B makes it possible to prevent a position shift from the concave portions 1A at the time of patterning of the ion-implanted layer 2. Therefore, the device region PA can be positioned with high accuracy by reference to the mark region RB.

Figure 2G:
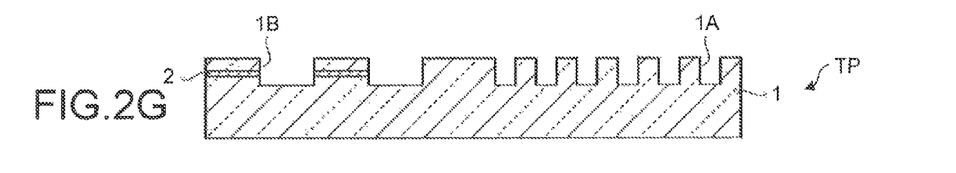

Next, as illustrated in FIG. 2G, the resist pattern 4 and the protective film 3 are separated from the substrate 1.

Figure 3:
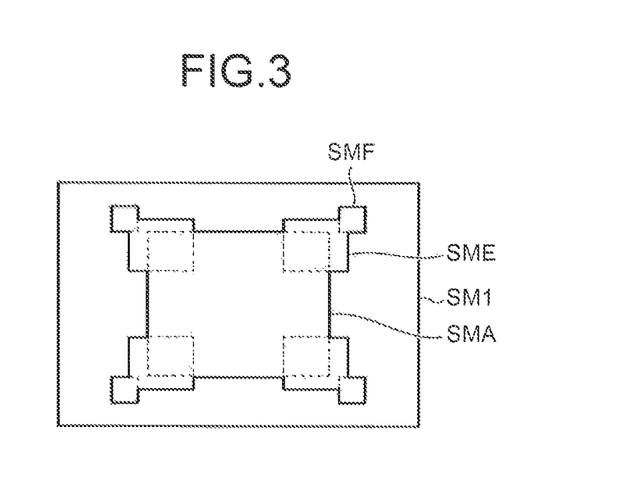
FIG. 3 is a plane view of a modification example of the stencil mask in FIG. 1.

FIG. 3 is a plane view of a modification example of the stencil mask in FIG. 1.

Referring to FIG. 3, a stencil mask SM1 is provided with an opening SMA corresponding to the mark region RB. Openings SME are provided at the four corners of the opening SMA. The openings SME may be smaller in area than the opening SMA. Further, openings SMF are provided adjacent to the openings SME. The openings SMF may be arranged on the diagonal lines of the opening SMA. The openings SMF may be smaller in area than the openings SME. The area here refers to the area prior to the addition of the openings SME and SMF to the opening SMA. By adding the openings SME and SMF to the opening SMA, it is possible to form the four corners of the opening SMA in a stepwise manner to allow finer correction to be made to ion distribution. In the embodiment described above, the two-step opening pattern is added to the four corners of the opening SMA. Alternatively, a three or more-step opening pattern may be added to the four corners of the opening SMA.

Second Embodiment

Figure 4A:
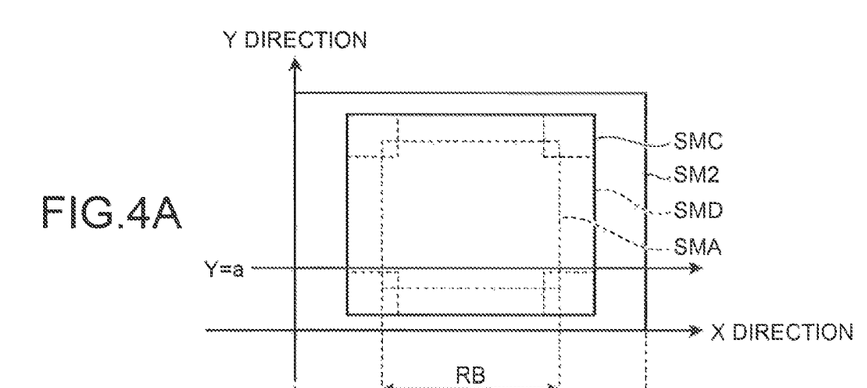
FIG. 4A is a plane view of a configuration example of a stencil mask according to a second embodiment.
Figure 4B:
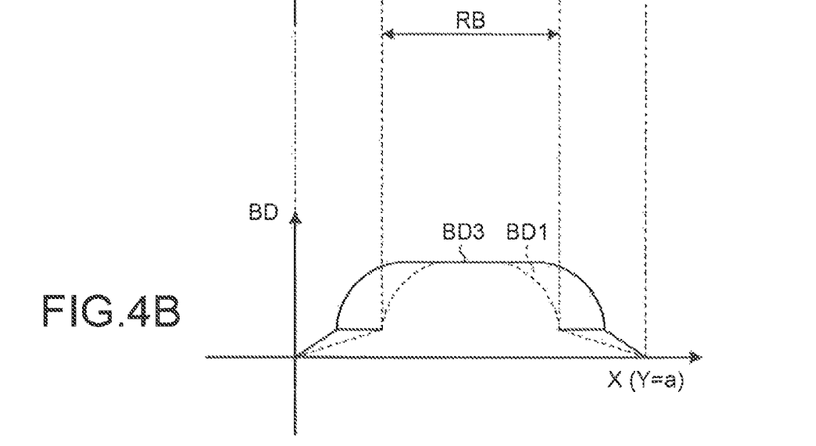
FIG. 4B is a diagram illustrating ion distribution of an ion-implanted layer in FIG. 1B according to the presence or absence of the openings SMC and SMD in FIG. 4A.

FIG. 4A is a plane view of a configuration example of a stencil mask according to a second embodiment, and FIG. 4E is a diagram illustrating ion distribution of an ion-implanted layer in FIG. 1B according to the presence or absence of the openings SMC and SMD in FIG. 4A. FIG. 4E illustrates ion distribution BD at the position of Y=a in FIG. 4A. The ion distribution BD1 shows an ion distribution when ion implantation is performed with the use of the stencil mask with the opening SMA. The ion distribution BD3 shows an ion distribution when ion implantation is performed with the use of a stencil mask SM2 with the openings SMC and SMD on the outside of the mark region RB. The openings SMC may be added to the four corners of the opening SMA. The openings SMD may be added to the tour sides of the opening SMA, adjacent to the openings SMA and SMC. At that time, the openings SMC and SMD may surround the outer periphery of the opening SMA. The opening pattern formed by the openings SMA, SMC, and SMD may be larger in area than the opening SMA. In addition, the opening pattern formed by the openings SMA, SMC, and SMD may be a rectangular pattern extended on the outside of the mark regions RB. Without the openings SMC and SMD, the ion concentration of the mark region RB at the both ends is lowered by the shielding effect of the two sides of the stencil mask with the opening SMA. In contrast, with the openings SMC and SMD, it is possible to allow the shielding effect of the stencil mask at the two sides to exert on the outside of the mark region RB to suppress expansion of the shielding effect of the stencil mask at the two sides in the mark region RB. This improves uniformity of ion distribution in the entire mark region RB.

Third Embodiment

FIGS. 5A to 5E are cross-sectional diagrams illustrating an imprinting method using a template accord ing to a third embodiment.

Figure 5A:
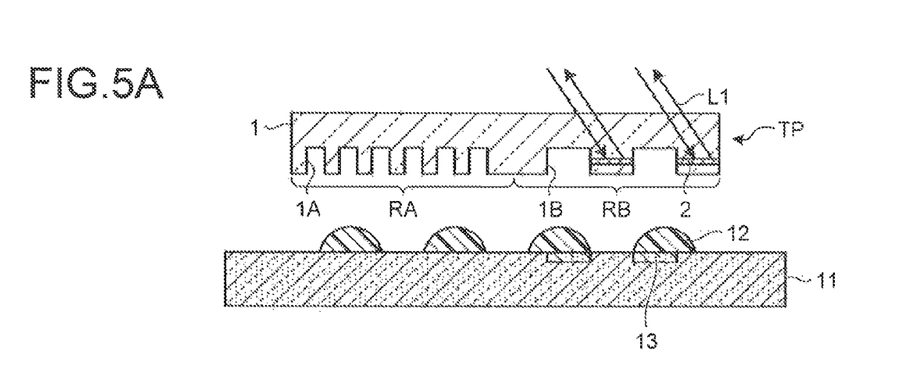
FIGS. 5A to 5E are cross-sectional diagrams illustrating an imprinting method using a template according to a third embodiment.

Referring to FIG. 5A, concave portions 1A are provided in a device region RA, and concave portions 1B are provided in a mark region RB. The concave portions 1A can be made thinner than the concave portion 1B, and for example, the width of the concave portions 1A and the space between the same can be set in nanometer order. In addition, an ion-implanted layer 2 is provided in the mark region RB. The ion-implanted layer 2 can be patterned at the concave portions 1B to constitute alignment marks. The ion-implanted layer 2 can be different from a substrate 1 in optical property. The optical property may be refraction index or extinction constant, for example. The ion-implanted layer 2 may constitute a light-absorbing layer, light-scattering layer, or light-reflecting layer. For example, the ion-implanted layer 2 can constitute a light-absorbing layer by implanting ions of antimony or the like absorbing light, for example. In the case of using a light-absorbing layer as the ion-implanted layer 2, it is preferred to set a light-absorbing wavelength band in an infrared region of 500 to 800 nm to make a processing layer 11 more visible.

Then, an imprint material 12 is discharged onto the processing layer 11 by using an ink-jet technique or the like. Formed on the processing layer 11 are alignment marks 13 for use in alignment with the template TP. The processing layer 11 may be a semiconductor wafer, a semiconductor layer, a metal layer, or an insulating layer. The imprint material 12 may be an ultraviolet-setting resist, for example.

Detecting alignment lights L1 from the ion-implanted layer 2 makes it possible to identify the position of the template TP and align the template TP with the processing layer 11.

Figure 5B:
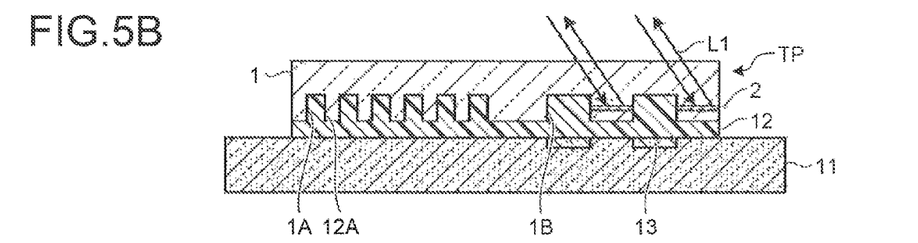

Next, as illustrated in FIG. 5B, the template TP is brought into contact with the imprint material 12 to charge the imprint material 12 into the concave portions 1A and form an imprint pattern 12A on the processing layer 11. At that time, detecting the alignment lights L1 from the ion-implanted layer 2 makes it possible to identify the position of the template TP and detect any misalignment of the template TP and the processing layer 11. Unifying ion distribution in the ion-implanted layer 2 here makes it possible to reduce variations in the alignment lights L1 and improve the accuracy of alignment measurement.

Figure 5C:
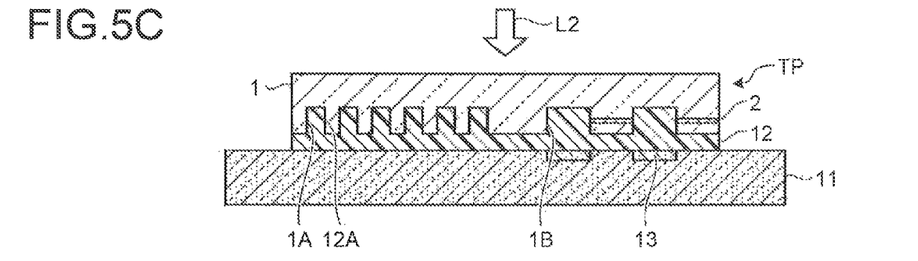

Next, as illustrated in FIG. 5C, while the template TP is in contact with the imprint pattern 12A, the imprint pattern 12A is irradiated with ultraviolet light L2 through the template TP to harden the imprint pattern 12A. In the example of FIG. 5C, an ultraviolet-setting resist may be used as the imprint material 12 to harden the imprint pattern 12A, or a thermosetting resist may be used instead.

Figure 5D:
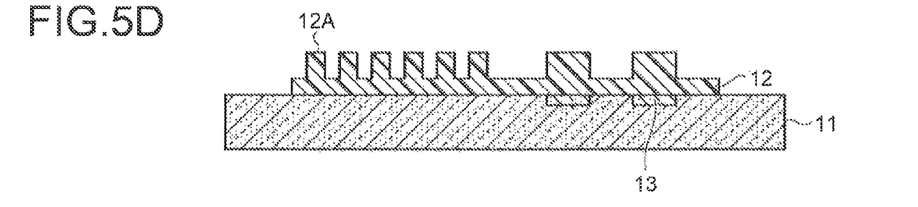

Next, as illustrated in FIG. 5D, after the imprint pattern 12A is hardened, the template TP is removed from the imprint pattern 12A.

Figure 5E:
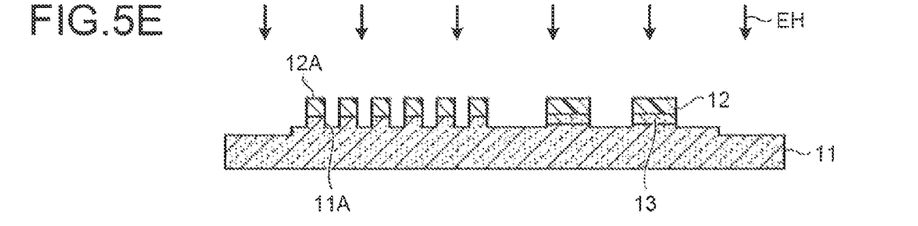

Next, as illustrated in FIG. 5E, the processing layer 11 is subjected to etching EH via the imprint pattern 12A to transfer the imprint pattern 12A to the processing layer 11 and form a process pattern 11A corresponding to the imprint pattern 12A on the processing layer 11. Then, the imprint pattern 12A left on the processing layer 11 is removed. The processing layer 11 may be subjected to ion implanting, instead of the etching EH.

Described in relation to the foregoing embodiments are methods for providing the openings SMB at the opening SMA to unify ion distribution in the ion-implanted layer 2. Alternatively, the openings SMB may be provided at the opening SMA to unify the optical property of the ion-implanted layer 2, or the openings SMB may be provided at the opening SMA to reduce variations in the alignment lights L1.

Fourth Embodiment

Figure 6:
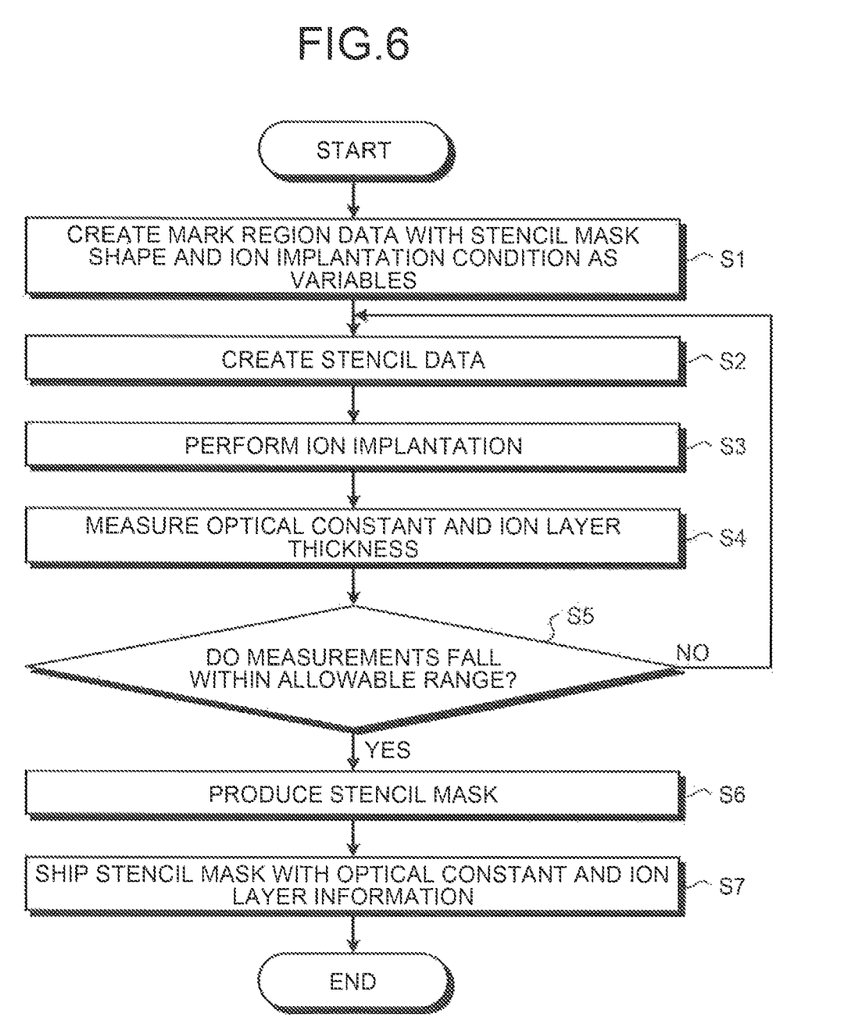
FIG. 6 is a flowchart of a stencil mask manufacturing method according to a fourth embodiment.

FIG. 6 is a flowchart, of a stencil mask manufacturing method according to a fourth embodiment.

Referring to FIG. 6, data on the mark region RB is created with the shape of the stencil mask SM and an ion implantation condition as variables (S1). Next, data on the stencil mask SM is created based on the data on the mark region RB (S2). Next, ion implantation is performed on the substrate 1 via the stencil mask SM produced based on the data at S2 to form the ion-implanted layer 2 on the substrate 1 (S3). The ion implantation may be performed using the real stencil mask SM and substrate 1, or simulation of the ion implantation may be performed using models of the stencil mask SM and the substrate 1. Next, the optical property and film thickness of the ion-implanted layer 2 are acquired (S4). In the case of performing the ion implantation using the real stencil mask SM and substrate 1, the optical property and film thickness of the ion-implanted layer 2 can be measured. In the case of performing the simulation using the models of the stencil mask SM and substrate 1, the optical property and film thickness of the ion-implanted layer 2 cart be calculated.

Next, it is determined whether the optical property and film thickness of the ion-implanted layer 2 fall within allowable ranges (S5). Then, if the optical property and film thickness of the ion-implanted layer 2 do not fall within the allowable range, the process is returned to S2 to repeat S2 to S5 until the optical property and film thickness of the ion-implanted layer 2 fall within the allowable ranges. When the optical property of the ion-implanted layer 2 does not fall within the allowable range, the shape of the stencil mask SM can be changed. When the film thickness of the ion-implanted layer 2 does not fail within the allowable range, dose amount and acceleration voltage in the ion implantation can be changed. Setting the film thickness of the ion-implanted layer 2 within the allowable range here decreases S/N at the time of alignment light measurement.

Meanwhile, when the optical property and film thickness of the ion-implanted layer. 2 fall within the allowable ranges, the stencil mask SM is produced based on the data at S2 (S6) and then is shipped (S7). The stencil mask SM can be shipped together with the information or the optical property and film thickness of the ion-implanted layer 2.

Fifth Embodiment

Figure 7:
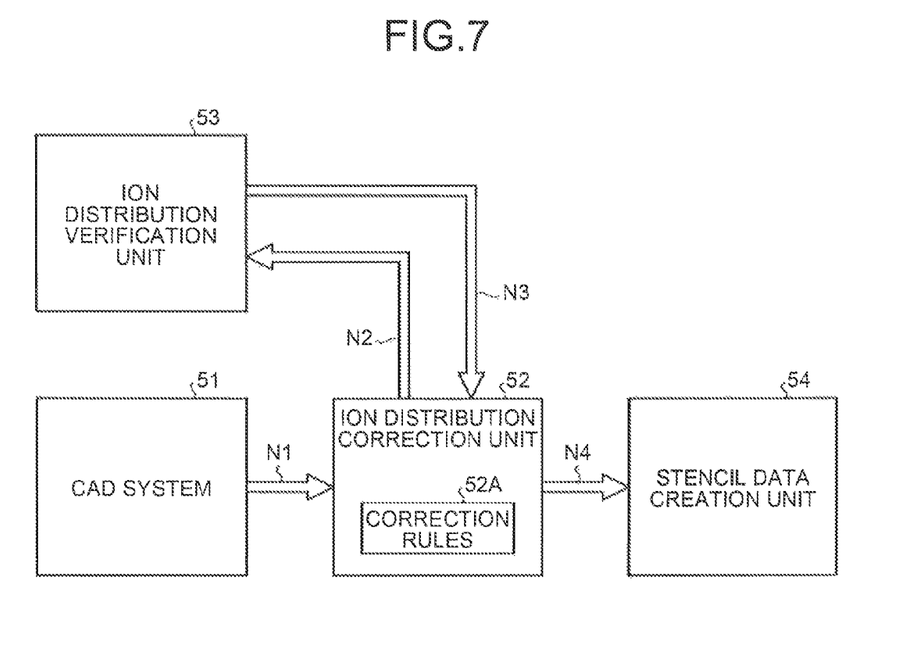
FIG. 7 is a block diagram illustrating a stencil mask design device according to a fifth embodiment.

FIG. 7 is a block diagram illustrating a stencil mask design device according to a fifth embodiment.

Referring to FIG. 7, the stencil mask design device includes a CAD system 51, an ion distribution correction unit 52, an ion distribution verification unit 53, and a stencil data creation unit 54. The ion distribution correction unit 52 can hold correction rules 52A. The correction rules 52A can provide information on the shape, position, size, and the like of the openings SMB.

Then, at the CAD system 51, design layout data N1 of a stencil mask is created and sent to the ion distribution correction unit 52. Then, at the ion distribution correction unit 52, the openings SMB are added to the opening SMA based on the correction rules 52A, and correction data N2 on the addition is sent to the ion distribution verification unit 53.

Then, at the ion distribution verification unit 53, simulation of ion implantation is performed via the stencil mask produced based on the correction data N2 to calculate ion distribution in the ion-implanted layer. Then, it is verified whether the ion distribution in the ion-implanted layer in the mark region falls within a predetermined range. When the ion distribution in the ion-implanted layer does not fall within the predetermined range, verification result N3 is sent to the ion distribution correction unit 52. Then, at the ion distribution correction unit 52, upon receipt of the verification result N3 that the ion distribution in the ion-implanted layer does not fall within the predetermined range, the openings SMB to be added to the opening SMA are changed and the correction data N2 on the change is sent to the ion distribution verification unit 53. Meanwhile, at the ion distribution correction unit 52, upon receipt of the verification result N3 that the ion distribution in the ion-implanted layer falls within the predetermined range, correction data N4 at that time is sent to the stencil data creation unit 54. Then, at the stencil data creation unit 54, stencil data is created based on the correction data N4. The foregoing descriptions are given only as to the opening SMB. However, the same thing is also applicable to the openings SMC to SMF.

Figure 8:
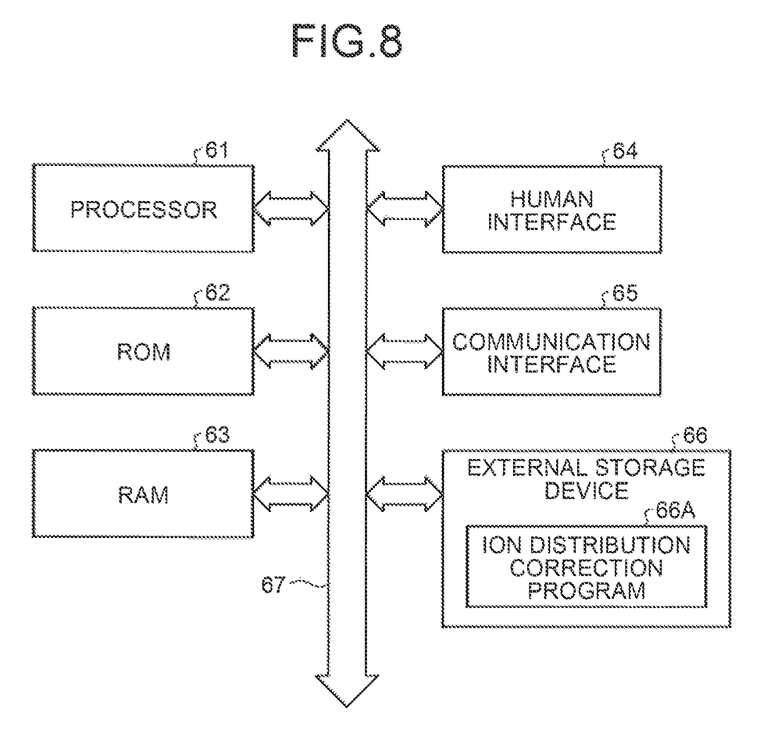
FIG. 8 is a block diagram illustrating a hardware configuration of the stencil mask design device illustrated in FIG. 7.

FIG. 8 is a block diagram illustrating a hardware configuration of the stencil mask design device illustrated in FIG. 7.

Referring to FIG. 8, the stencil mask design device can be provided with a processor 61 including a CPU and the like, a ROM 62 that stores fixed data, a RAM 63 that provides a work area or the like to the processor 61, a human interface 64 that intermediates between a human and a computer, a communication interface 65 that provides a means for communicating with the outside world, and an external storage device 66 that stores programs and various data for operating the processor 61. The processor 61, ROM 62, RAM 63, human interface 64, communication interface 65, and external storage device 66 are connected together via a bus 67.

The external storage device 66 can be a magnetic disc such as a hard disc, an optical disc such as a DVD, a portable semiconductor storage device such as a USB memory or a memory card, or the like. The human interface 64 may be a keyboard, mouse, or touch panel as an input interface, and a display or a printer, as an output interface, or the like, for example. The communication interface 65 may be an LAN card, modem, or router for connection with the Internet, an LAN, or the like. The external storage device 66 has installed therein an ion distribution correction program 66A to correct the shape of a stencil mask so that ion distribution in an ion-implanted layer embedded in mark regions of a template can be unified in the mark regions. Then, when the ion distribution correction program 66A is executed at the processor 61, correction data for the stencil mask is calculated.

The ion distribution correction program 66A to be executed at the processor 61 may be stored in the external storage device 66 and read into the RAM 63 at execution of the program, or may be stored in advance in the ROM 62, or may be acquired via the communication interface 65. In addition, the ion distribution correction program 66A may be executed on a stand-alone computer or a cloud computer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A stencil mask, comprising:
a first opening provided corresponding to a mark region of a template; and
a plurality of second openings provided at four corners of the first opening in a same layer of the stencil mask as the first opening, wherein
a radius of a circle circumscribing one of the second openings is smaller than a radius of a circle circumscribing the first opening.

2. A stencil mask, comprising:
a first opening provided in correspondence with a mark region of a template; and
a plurality of second openings provided at four corners of the first opening in a same layer of the stencil mask as the first opening, wherein
each of the second openings is smaller in area than the first opening.

3. The stencil mask of claim 2, further comprising a third opening provided adjacent to one of the second openings, wherein
the third opening is smaller in area than the one of the second openings.

4. The stencil mask of claim 2, further comprising, as a subsection of the first opening, a fourth opening that is provided adjacent to the first opening and the second openings and increases area of the first opening.

5. The stencil mask of claim 4, wherein the second openings and the fourth opening are arranged to surround an outer periphery of the first opening.

6. A manufacturing method of a stencil mask, comprising:
adding a plurality of second openings to a first opening provided in the stencil mask corresponding to a mark region of a template, wherein the second openings are provided at four corners of the first opening in a same layer of the stencil mask as the first opening;
acquiring distribution of impurities in an impurity layer formed in the mark region through the first opening to which the second openings are added; and
updating position or size of the second openings based on the distribution of impurities in the impurity layer.

7. The manufacturing method of a stencil mask of claim 6, wherein, the position or size of the second openings is updated to make the impurities uniform in the impurity layer in the mark region.

8. The manufacturing method of a stencil mask of claim 6, wherein a circle circumscribing one of the second openings is smaller in diameter than a circle circumscribing the first opening.

9. The manufacturing method of a stencil mask of claim 6, wherein at least one of the second openings the second opening is smaller in area than the first opening.

10. An imprinting method, comprising:
forming an imprint material on a processing layer;
identifying a position of a template by referring to an alignment mark provided in a mark region of the template while the template is in contact with the imprint material;
forming an imprint pattern on the processing layer by transferring a template pattern provided in a device region of the template to the imprint material, and;
forming a processed pattern on the processing layer by transferring the imprint pattern to the processing layer, wherein
an impurity layer is formed in the mark region by performing ion implantation into the mark region via a stencil mask in which a first opening is provided corresponding to the mark region, and
the stencil mask includes a plurality of second openings that are provided at four corners of the first opening in a same layer of the stencil mask as the first opening.

11. The imprinting method of claim 10, wherein a circle circumscribing one of the second openings is smaller in diameter than a circle circumscribing the first opening.

12. The imprinting method of claim 10, wherein at least one of the second openings is smaller in area than the first opening.

\* \* \* \* \*